United States Patent

[11] 3,629,022

[72] Inventor Lewis Terry
Phoenix, Ariz.

[21] Appl. No. 714,714
[22] Filed Mar. 20, 1968
[45] Patented Dec. 21, 1971
[73] Assignee Motorola, Inc.
Franklin Park, Ill.

[54] USE OF PLATINUM THIN FILMS AS MASK IN SEMICONDUCTOR PROCESSING
6 Claims, 8 Drawing Figs.

[52] U.S. Cl. .......... 156/17,
156/11, 156/13, 148/187, 29/578
[51] Int. Cl. .......... H01l 7/50
[50] Field of Search .......... 156/3, 13,
17, 11; 117/112; 148/187; 29/578

[56] References Cited
UNITED STATES PATENTS

| | | | |
|---|---|---|---|
| 3,370,948 | 2/1968 | Rosenbauer .......... | 96/36.2 |
| 3,231,421 | 1/1966 | Schmidt .......... | 117/212 |

*Primary Examiner*—Jacob H. Steinberg
*Attorney*—Mueller & Aichele

ABSTRACT: Platinum thin films are selectively etched by a method that begins with the deposition of an aluminum film on the platinum film. The reverse image of that desired in the platinum film is then patterned in the aluminum. The combination is heated to 400° to 500° C. for a time sufficient to form a platinum-aluminum intermetallic compound. The intermetallic compound is then readily removed by etching whereby the remaining platinum is delineated in the reverse of the aluminum pattern.

INVENTOR.
Lewis E. Terry
BY
Mueller, Aichele, & Rauner
Atty's

USE OF PLATINUM THIN FILMS AS MASK IN SEMICONDUCTOR PROCESSING

BACKGROUND

This invention relates to thin-film platinum metallization, and more particularly to a method for delineation of such films by selective etching. The method is particularly useful in the fabrication of semiconductor microelectronic structures.

Overlay metallization has become a standard practice in the fabrication of a wide variety of semiconductor devices. To be suitable for use in overlay metallization, a metal must (1) be capable of making good ohmic contact to the semiconductor, (2) be an excellent conductor, (3) adhere well to both the semiconductor and to the silicon dioxide or other passivation layer, (4) be chemically compatible with the passivation layer, (5) provide a suitable base for the attachment of leads, and (6) be amenable to selective etching procedures for the delineation of desired patterns.

From the standpoint of convenience and cost reduction, it is obviously desirable to select a single metal capable of satisfying all these requirements. Aluminum has been found satisfactory for a wide range of applications and is the only metal which has seen widespread commercial use for overlay metallization. Aluminum is far from perfect, however, and the need for continued improvement in metallization systems is recognized throughout the industry.

Numerous two-layer and three-layer metallization systems have been thoroughly investigated as an alternate approach. That is, a first metal layer is deposited capable of forming particularly good ohmic contact with the semiconductor and capable of adhering to the passivation layer without interaction, followed by the deposition of one or more additional layers to provide the best possible surface for lead attachment. Common examples of such plural layer systems include molybdenum-gold, aluminum-molybdenum-gold, aluminum-nickel, aluminum-nichrome, chromium-gold, etc. Increasing attention has been given recently to platinum-comprising systems including titanium-platinum-gold, chromium-platinum-gold and to the use of platinum alone. The delineation of platinum films has proved difficult however, because of its etch resistance, and because of the inherent limitations of the usual photoresist compositions used for selective etching techniques.

THE INVENTION

It is an object of the invention to provide an improved technique for the delineation of platinum thin films. It is a further object to provide an improved platinum overlay metallization procedure for semiconductor device fabrication, alone or in combination with other metal films.

It is a further object of the invention to facilitate the delineation of multilayer platinum-comprising metallization films, by providing an improved method for the selective etching of a platinum film, followed by the step of using the patterned platinum as a mask for selective etching of the underlying metal film or films.

It is a primary feature of the invention to render the platinum film more readily etchable by first converting the unwanted areas of the platinum film to a platinum-comprising intermetallic compound. More particularly, it is a primary feature of one embodiment of the invention to deposit aluminum on the platinum film, and then to selectively etch the aluminum to provide in the aluminum film the reverse image of the pattern desired in the platinum, followed by the step of heating the composite film to a temperature sufficient to form a platinum-aluminum intermetallic compound having the same pattern as the aluminum.

In multilayer metallization system it is an additional feature of the invention to use the patterned platinum film as a mask in the selective etching of underlying metal film or films.

The invention is embodied in a method for selectively etching a platinum film beginning with the step of depositing on the platinum film a metal capable of forming an intermetallic compound with the platinum that is more readily etchable than the platinum itself. Aluminum is a preferred example of such a metal. Silicon is also suitable. The aluminum or other overlying film is then patterned by selective etching to form the reverse image of the pattern desired in the platinum. The combined films are then heated to a temperature sufficient to form an intermetallic compound with the platinum. In the case of aluminum, a temperature of 400° to 500° C. is sufficient. Thereafter, the intermetallic compound is etched away whereby the remaining platinum is delineated in the desired pattern.

The invention is also embodied in a method for providing a passivated semiconductor microelectronic structure with titanium-platinum metallization, beginning with the step of selective etching to provide windows in the passivation layer at locations where contact with the semiconductor structure is desired. A titanium film of suitable thickness is then deposited on the structure whereby ohmic contact with the semiconductor structure is established at the location exposed by the selective etching step. A platinum film is deposited on the titanium layer and then an aluminum film is deposited upon the platinum.

As outlined above, the aluminum is then patterned to form the reverse image of that desired in the platinum, followed by heating to form a platinum-aluminum intermetallic compound and etching to remove the intermetallic compound thereby delineating the platinum in the desired pattern. Thereafter, using the platinum pattern as a mask, the titanium film is selectively etched to complete the titanium-platinum metallization pattern.

Use of the invention is contemplated whenever it is desired to pattern a platinum film. A particularly attractive use is found in the fabrication of microelectronic semiconductor devices, including particularly integrated monolithic silicon circuits. It is known to provide such circuits with a surface layer of dielectric passivation consisting for example, of silicon dioxide, silica-alumina, silicon nitride, or combinations of any two or more such materials. In providing such structures with a metallization pattern in accordance with the invention, windows are provided in the passivation layers using known techniques, including particularly photoresist and selective etching. A titanium layer of suitable thickness for example, 500 to 2,500 angstroms, is provided by known methods, such as vacuum evaporation or sputtering. A platinum layer of 1,000 to 3,000 angstroms is thereafter applied covering the titanium layer. Preferably, the platinum deposition is continued in the same apparatus as the titanium, without exposing the titanium to the atmosphere. An aluminum film of 3,000 to 5,000 angstroms thickness is then applied on the platinum layer by known techniques, including vacuum evaporation or sputtering.

The aluminum film is then patterned by selective etching to provide the reverse image of that desired in the platinum film. That is, aluminum is patterned to cover only those areas of the platinum film which are to be removed. The composite structure is then subjected to sintering at a temperature sufficient to cause the formation of a intermetallic platinum compound. A temperature of 400° to 500° C. is generally adequate. For example, 10 to 15 minutes at 450° C. is preferred.

Subsequent etching of the platinum-aluminum compound is preferably conducted in stages. First a potassium or sodium hydroxide solution is used to remove the aluminum-rich layers, followed by the use of warm aqua regia to remove the platinum-rich layers. The temperature and strength of the aqua regia are selected to avoid appreciable attack of the pure platinum. The aqua regia does not etch the underlying titanium. For example, 1 to 2 minutes at 50° C. is generally adequate to remove the aluminum-rich layers, while 30 seconds to 1 minute at 50° C. in aqua regia is generally adequate to remove the remaining layers of platinum-aluminum compound. In this solution the PtAl compound etches approximately 10 times faster than the Pt.

Thereafter, using the platinum pattern as a mask, the exposed areas of the titanium layer are removed by immersing the composite structure in a suitable Ti etchant, for example, a dilute $H_2SO_4$ solution.

In accordance with one embodiment the titanium layer may be omitted altogether. In this case the platinum is deposited directly upon the oxide or other passivation layer thereby establishing contact with the semiconductor structure at the locations exposed by windows in the passivation layer. In this embodiment the metallization procedure is complete upon removal of the platinum-aluminum intermetallic compound.

Suitable results may also be obtained by substituting other refractory metals for titanium. Particularly useful alternates include chromium, tantalum, molybdenum, tungsten, nickel and zirconium.

DRAWINGS

Figure 1:
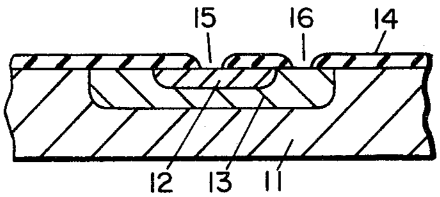
FIG. 1 is a greatly enlarged cross section of a microelectronic semiconductor structure to be metallized in accordance with the invention.

As shown in FIG. 1 semiconductor body 11 has been provided with an emitter zone 12 and base 13. Passivation layer 14 has been provided with windows 15 and 16 for the purpose of establishing contact with the emitter and base, respectively. Semiconductor 11 will usually be silicon; however, germanium and other semiconductor materials may be used, including for example, gallium arsenide and other III–V compound semiconductors. Passivation layer 14 will normally be silicon dioxide; however, other materials such as silica-alumna, silicon nitride, or other dielectric layer may be used. Windows 15 and 16 are formed in accordance with known procedures for selective etching.

Figure 2:
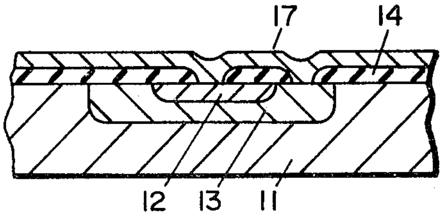
Figure 3:
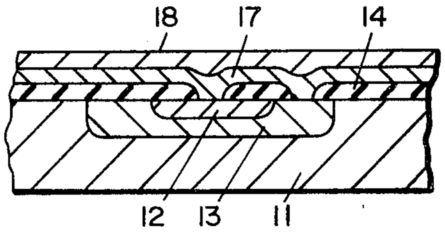
Figure 4:
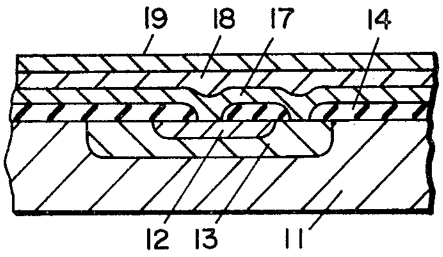

FIG. 2 illustrates the addition of titanium or other refractory metal film 17 to the structure of FIG. 1, whereby contact is established with emitter 12 and base 13. The titanium layer is added by vacuum evaporation or sputtering in accordance with known procedures. In FIG. 3 platinum film 18 is added covering titanium film 17. The platinum is also added in accordance with known procedures. FIG. 4 illustrates the addition of aluminum film 19 to cover platinum film 18. The aluminum is also added in accordance with known procedures.

Figure 5:
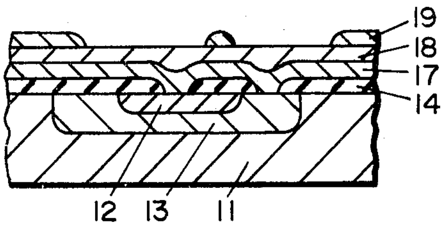
FIGS. 2 through 7 are greatly enlarged cross sections illustrating various intermediate stages in the process of the invention.

FIG. 5 illustrates the selective etching of aluminum film 19 to produce a pattern having the reverse image of that desired for platinum layer 18. Selective etching of the aluminum film is carried out in accordance with known procedures, including for example the use of photoresist to form a masking pattern, followed by the use of sodium hydroxide or other suitable etchant for the aluminum, and subsequent removal of the resist film.

Figure 6:
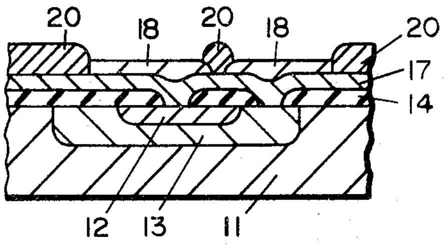
Figure 7:
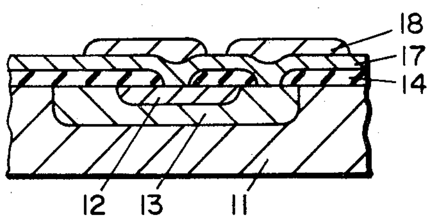

FIG. 6 illustrates the formation of a platinum-aluminum intermetallic compound layer 20 produced by heating the composite structure to at least 400° C. for a time sufficient to permit interaction of layers 18 and 19. Preferably this step is conducted at about 450° C. for 10 to 15 minutes. In FIG. 7 the removal of platinum-aluminum layer 20 is illustrated. This layer could be removed in a single step by a use of an etchant. Preferably, however, the layer is removed in stages since the first increments to be removed are aluminum-rich and the subsequent or final increments are platinum-rich. Therefore, initially, the use of sodium hydroxide or other aluminum etch is adequate to remove the aluminum-rich layers, whereas subsequently the use of aqua regia is suitable to remove the platinum-rich layers. The severity of the final etch can be limited in order to avoid appreciable attack of pure platinum layer 18. For example, the removal of layer 20 is carried out at 50° C. by treatment with sodium hydroxide for 1 to 2 minutes, followed by ½ to 1 minute immersion in aqua regia at the same temperature.

Figure 8:
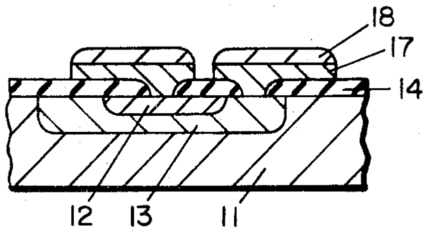
FIG. 8 is a greatly enlarged cross section illustrating the metallization system completed in accordance with one embodiment of the invention.

As illustrated in FIG. 8 unwanted areas of titanium film 17 are then removed by an acid etch, using the platinum as a mask, thereby completing the titanium-platinum metallization pattern in accordance with the invention.

Although the foregoing description is limited to the delineation of platinum films, it will be apparent that the invention is also useful in the delineation of palladium and rhodium films, for example, and in the delineation of any etch-resistant metal which forms a more readily etchable intermetallic compound with another metal, such as aluminum or silicon does with the platinum.

I claim:

1. A method for providing a passivated semiconductor microelectronic structure with an etch-resistant metallization pattern which comprises opening windows in the passivation layer selected from the group comprising silicon dioxide, silicon-aluminum and silicon nitride at locations where contact with the structure is desired, depositing a first film of refractory metal selected from the group comprising titanium, chronium, tantalum, molybdenum, tungsten, nickel and zirconium on the windowed passivation layer, depositing a second film of a metal selected from the platinum-palladium family on the first film, depositing a third film of silicon or aluminum on the second film, depositing a third film of silicon or aluminum on the second film, patterning the third film to form the reverse image of that desired in the second film, heating the structure to at least 400° C. for a time sufficient to form an intermetallic compound formed by the metals of said second and third films, then etching away said intermetallic compound whereby the remaining second film is delineated in the reverse of said third film image, then etching away the first film using the remaining second film as a mask.

2. A method as defined by claim 1 wherein the first, second and third films are titanium, platinum and aluminum, respectively.

3. A method for etching, comprising the steps of:

depositing a first metal film selected from the platinum-palladium family on a semiconductor;

depositing on said first metal film a second film selected from the group comprising aluminum and silicon for forming with said first film a compound of greater etchability;

patterning said second film for forming a reverse image of that desired in said first metal film;

heating said first metal film in combination with said second film to a temperature sufficient to form said compound of greater etchability; and etchably removing said compound whereby; said remaining first metal film is delineated in the reverse image formed in said second film.

4. The method as recited in claim 3, wherein said heating step is performed within a temperature range of 400° to 500° C.

5. The method as recited in claim 3, wherein:

said first metal layer comprises platinum, said second layer comprises aluminum;

said etchably removing step, further comprises:

immersing said platinum and aluminum structure in an etchant selected from the group comprising potassium hydroxide and sodium hydroxide for removing the aluminum-rich portion of said compound; and immersing said platinum and aluminum structure in an etchant of aqua regia for removing the platinum rich portion of said compound.

6. The method as recited in claim 2 wherein said etching step further comprises;

immersing said structure in an etchant selected from the group comprising potassium hydroxide and sodium hydroxide for removing the aluminum-rich portion of said intermetallic compound; and immersing said structure in an etchant of aqua regia for removing the platinum-rich portion of said compound.